(12) United States Patent
Schmid et al.

(10) Patent No.: US 7,985,530 B2
(45) Date of Patent: Jul. 26, 2011

(54) ETCH-ENHANCED TECHNIQUE FOR LIFT-OFF PATTERNING

(75) Inventors: Gerard M. Schmid, Austin, TX (US); Douglas J. Resnick, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 980 days.

(21) Appl. No.: 11/856,862

(22) Filed: Sep. 18, 2007

(65) Prior Publication Data

US 2010/0266965 A1    Oct. 21, 2010

Related U.S. Application Data

(60) Provisional application No. 60/824,762, filed on Sep. 25, 2006, provisional application No. 60/826,124, filed on Sep. 19, 2006.

(51) Int. Cl.
  *G03F 7/26* (2006.01)
(52) U.S. Cl. .......................... 430/314; 430/329
(58) Field of Classification Search .................. 430/314, 430/329; 862/314
  See application file for complete search history.

(56) References Cited

U.S. PATENT DOCUMENTS

| 5,773,200 A * | 6/1998 | Okazaki et al. ............. 430/324 |
| 6,207,570 B1 | 3/2001 | Mucha |
| 6,274,393 B1 | 8/2001 | Hartswick |
| 6,284,653 B1 | 9/2001 | Tseng |
| 6,696,220 B2 | 2/2004 | Bailey et al. |
| 6,713,237 B2 * | 3/2004 | Seigler et al. ............. 430/314 |
| 6,852,454 B2 | 2/2005 | Mancini et al. |
| 6,900,881 B2 | 5/2005 | Sreenivasan et al. |
| 6,916,584 B2 | 7/2005 | Sreenivasan et al. |
| 6,919,152 B2 | 7/2005 | Sreenivasan et al. |
| 6,926,929 B2 | 8/2005 | Watts et al. |
| 6,986,975 B2 | 1/2006 | Sreenivasan et al. |
| 7,027,156 B2 | 4/2006 | Watts et al. |

(Continued)

FOREIGN PATENT DOCUMENTS

JP    1107676    *   9/1997

OTHER PUBLICATIONS

PCT/US07/20234 International Search Report, Sep. 12, 2008.

*Primary Examiner* — Kathleen Duda
*Assistant Examiner* — Caleen O Sullivan
(74) *Attorney, Agent, or Firm* — Fish & Richardson P.C.; Heather L. Fianagan

(57) ABSTRACT

An enhanced process forming a material pattern on a substrate deposits the material anisotropically on resist material patterned to correspond to an image of the material pattern. The material is etched isotropically to remove a thickness of the material on sidewalls of the resist pattern while leaving the material on a top surface of the resist pattern and portions of the surface of the substrate. The resist pattern is removed by dissolution thereby lifting-off the material on the top surface of the resist pattern while leaving the material on the substrate surface as the material pattern. Alternately, a first material layer is deposited on the resist pattern and a second material layer is deposited and planarized. The second material layer is etched exposing the first material while leaving the second material in features of the resist pattern. The first material and the resist are removed leaving the first material pattern.

8 Claims, 6 Drawing Sheets

ETCH BACK OF
PLANARIZING
COATING

U.S. PATENT DOCUMENTS

| | | |
|---|---|---|
| 7,037,639 B2 | 5/2006 | Voisin |
| 7,070,405 B2 | 7/2006 | Sreenivasan et al. |
| 7,077,992 B2 | 7/2006 | Sreenivasan et al. |
| 7,136,150 B2 | 11/2006 | Sreenivasan et al. |
| 7,229,273 B2 | 6/2007 | Bailey et al. |
| 7,281,921 B2 | 10/2007 | Watts et al. |
| 7,309,225 B2 | 12/2007 | McMackin et al. |
| 2003/0232252 A1 | 12/2003 | Mancini et al. |
| 2004/0065252 A1 | 4/2004 | Sreenivasan et al. |
| 2004/0065976 A1 | 4/2004 | Sreenivasan et al. |
| 2005/0061773 A1 | 3/2005 | Choi et al. |
| 2005/0064344 A1 | 3/2005 | Bailey et al. |
| 2005/0084804 A1 | 4/2005 | Truskett et al. |
| 2005/0158419 A1 | 7/2005 | Watts et al. |
| 2005/0158900 A1 | 7/2005 | Lee et al. |
| 2005/0189676 A1 | 9/2005 | Sreenivasan |
| 2005/0230882 A1 | 10/2005 | Watts et al. |
| 2006/0019183 A1 | 1/2006 | Voisin |
| 2006/0035029 A1 | 2/2006 | Xu et al. |
| 2006/0063112 A1 | 3/2006 | Sreenivasan |
| 2006/0067650 A1 | 3/2006 | Chui |
| 2006/0113697 A1 | 6/2006 | Sreenivasan |
| 2007/0026324 A1 | 2/2007 | Yoshida et al. |
| 2007/0122942 A1 | 5/2007 | Sreenivasan et al. |
| 2007/0287081 A1 | 12/2007 | Cherala et al. |
| 2008/0095878 A1 | 4/2008 | Bailey et al. |
| 2008/0174046 A1 | 7/2008 | Choi et al. |

\* cited by examiner

ETCH BACK OF PLANARIZING COATING

ETCH

US 7,985,530 B2

ETCH-ENHANCED TECHNIQUE FOR LIFT-OFF PATTERNING

This application for patent claims priority to U.S. Provisional Patent Application Ser. No. 60/826,124 and U.S. Provisional Patent Application Ser. No. 60/824,762, which are hereby incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of N66001-66-C2003 awarded by the Space and Naval Warfare Systems Center San Diego (SPAWAR).

TECHNICAL FIELD

The field of the invention relates generally to nano-fabrication of structures. More particularly, the present invention is directed to a method of patterning a substrate.

BACKGROUND

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

An imprint lithography technique disclosed in each of the aforementioned United States patent application publications and United States patent includes formation of a relief pattern in a layer suitable for polymerization and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

SUMMARY

It may be difficult to produce a vertical or re-entrant resist profile when patterning at a high resolution; i.e., the resist profile may contain some slope. This may be true for patterns with high areal density. As a result, it has been difficult to create high resolution structures by lift-off patterning. Since it is difficult to solve the problem of resist profile, it may be desired to determine a solution to degrade or substantially remove the material that is deposited on the resist sidewall. Reactive ion etching (RIE) is effective for isotropic removal of a variety of materials that are patterned by the lift-off approach. Dry etch processes generally operate with much lower defect levels than lift-off processes. To reduce the process defects while maintaining the overall result of a lift-off process, a planarizing coating may be applied to allow selective etching of extraneous material from on top of the resist patterns. Existing approaches for high-resolution lift-off patterning may create moderate physical damage to the material that is deposited on the resist sidewalls. The present invention improves upon the existing practices by substantially removing the sidewall material. These and other embodiments are described more fully below.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
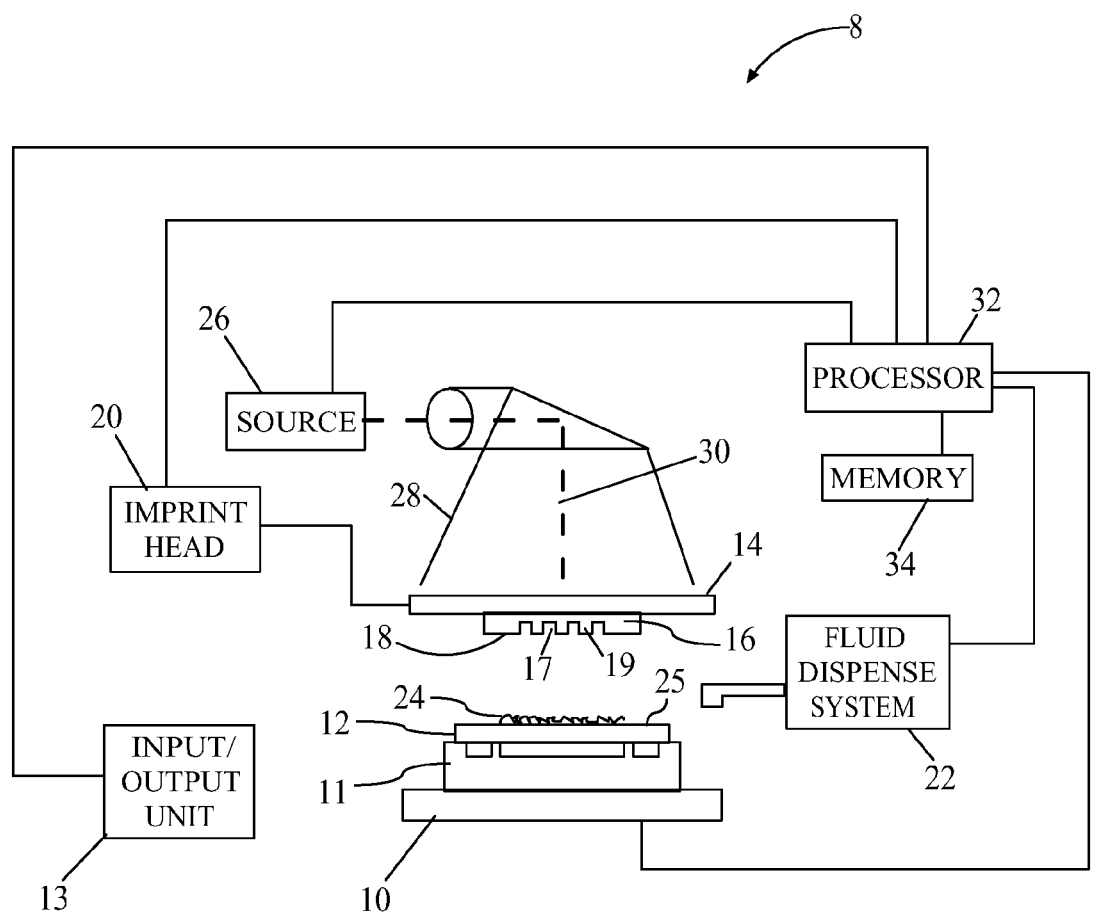
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19, with recessions 17 extending along a direction parallel to protrusions 19 that provide a patterning surface 18 with a shape of a battlement. However, recess 17 and protrusions 19 may correspond to virtually any feature desired, including features to create an integrated circuit and may be as small as a few nanometers. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit monomeric material 24 thereon. It should be understood that monomeric material 24 may be deposited using any known technique, e.g., drop dispense, spin-coating, dip coating, chemical vapor deposition (CVD), physical vapor deposition (PVD), and the like. Monomeric material 24 is polymerized upon ultra violet (UV) exposure.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume there between that is filled by monomeric material 24.

An exemplary source 26 may produce ultraviolet energy. Other energy sources may be employed, such as thermal, electromagnetic and the like. The selection of energy employed to initiate the polymerization of monomeric material 24 is known to one skilled in the art and typically depends on the specific application which is desired.

Referring to FIG. 1, typically, monomeric material 24 is disposed upon substrate 12 before the desired volume is defined between mold 16 and substrate 12. However, monomeric material 24 may fill the volume after the desired volume has been obtained. After the desired volume is filled with monomeric material 24, source 26 produces energy 28, e.g., broadband energy that causes monomeric material 24 to solidify and/or cross-link conforming to the shape of a surface 25 of substrate 12 and patterning surface 18.

The broadband energy may comprises an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process is regulated by a processor 32 that is in data communication with stage 10, imprint head 20, fluid dispense system 22, source 26, operating on a computer readable program stored in memory 34.

The above-mentioned may be further be employed in imprint lithography processes and system referred to in U.S. Pat. No. 6,932,934 entitled "Formation of Discontinuous Films During an Imprint Lithography Process;" United States patent application publication 2004/0124566, filed as U.S. patent application Ser. No. 10/194,991 entitled "Step and Repeat Imprint Lithography Processes;" and United States patent application publication 2004/0188381, filed as U.S. patent application Ser. No. 10/396,615, entitled "Positive Tone Bi-Layer Imprint Lithography Method"; and United States patent application publication 2004/0211754, filed as U.S. patent application Ser. No. 10/432,642, entitled "Method of Forming Stepped Structures Employing Imprint Lithography," all of which are incorporated by reference herein.

To that end, lithographic techniques for creating patterns in material may be generally characterized as either "additive" or "subtractive". Subtractive processes typically work by patterning a resist on top of the material and then using the resist as a mask during an etch process. The resist protects the material during the etching process, and thus the resist pattern is transferred into the underlying material. The resist may then be removed. Subtractive processes frequently require a highly tuned, anisotropic reactive ion etching (RIE) process.

Figure 2A:
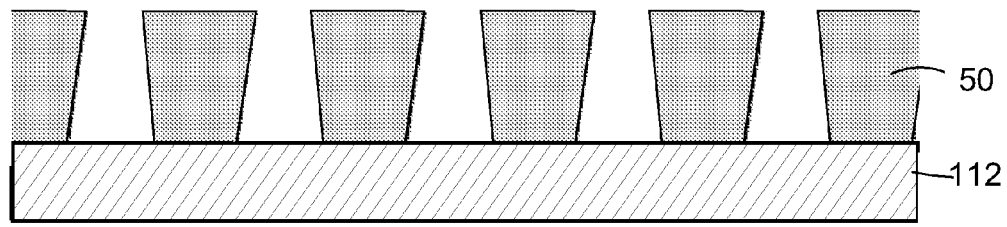
FIG. 2A is a side view of a substrate, as shown in FIG. 1, having a resist pattern with re-entrant sidewalls.
Figure 2B:
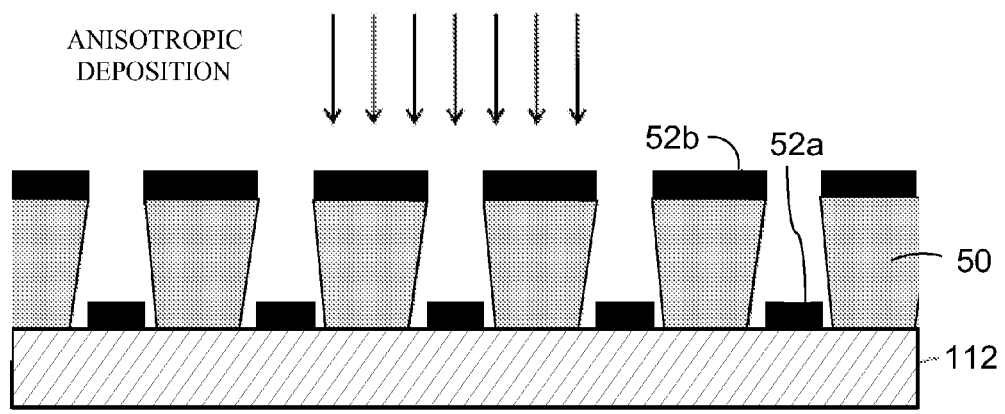
FIG. 2B is a side view of the substrate, shown in FIG. 2A, the resist pattern having an anisotropic deposition material positioned thereon creating a discontinuous film.
Figure 2C:
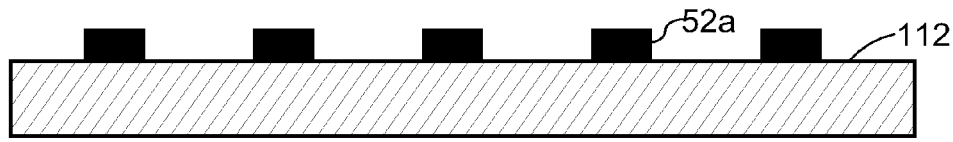
FIG. 2C is a side view of the substrate, shown in FIG. 2B, after immersion in a solvent, the resist material is dissolved and the extraneous material is removed by lift-off into solution, with the material that remains on the substrate forming a reverse image of the original resist pattern.

Referring to FIGS. 2A-2C, additive processes do not generally use RIE etching processes. The most widely used "additive" technique is termed "lift-off patterning" which involves imaging the resist 50 and then depositing the material 52 over the resist pattern 50. Material 52a is thus deposited directly on the substrate 112 in the regions where no resist is present. Material 52b is also deposited on top of the resist 50. This extra material 52b is removed by dissolving the underlying resist 50 in a liquid (usually an organic solvent), which causes the overlying material 52b to "lift-off" into the liquid solution. The lift-off process patterns the deposited material 52a, with a "negative-tone" image of the resist pattern, as shown in FIG. 2C.

Figure 3A:
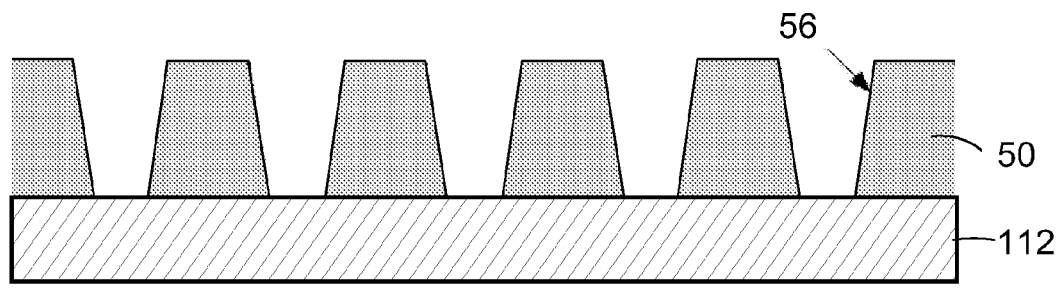
FIG. 3A is a side view of the substrate, shown in FIG. 1, having a resist pattern with sloped sidewalls.
Figure 3B:
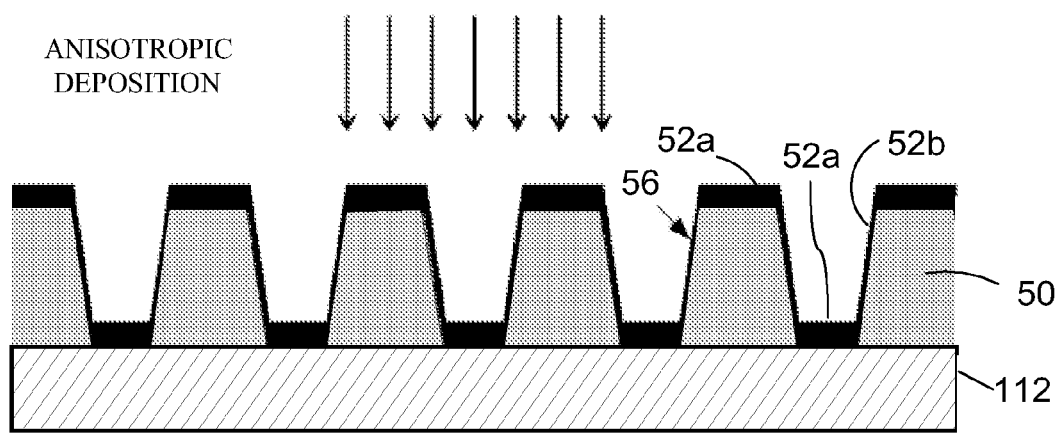
FIG. 3B is a side view of the substrate, shown in FIG. 3A, with deposition of material on the resist pattern with sloped sidewalls resulting in a continuous film that is connected to the substrate, the continuous film inhibiting the lift-off liquid from dissolving the resist and being difficult to remove because it is tethered to the substrate.

Referring to FIGS. 3A-3B, when performing a lift-off patterning process, it is preferable that the material 52 is deposited with high directionality (usually by vacuum evaporation). This ensures that the material 52a is mainly deposited on the underlying substrate 112 and the top of the resist features, as opposed to coating the resist sidewalls 56. Deposition of materials 52b on the sidewalls of the resist feature may cause several problems. First, the deposited material may form a continuous layer that prevents the liquid, as mentioned above with respect to FIGS. 2A-2C, from reaching the resist 50 during the lift-off dissolution process. The material 52b also provides a physical tether that may inhibit the material 52b from releasing into the liquid solution. Material 52b that is deposited on resist sidewalls 56 is also more likely to persist after the lift-off process, resulting in irregular patterning or unwanted residues.

One approach to minimize, if not prevent, deposition of material 52b on the resist sidewalls 56 is to incorporate a re-entrant profile in the resist pattern 50. The re-entrant portion of the resist sidewall 56 is "shadowed" such that the deposited material 52 forms a discontinuous film. Thus, the material 52a on the substrate 112 is not connected to the material 52b that is to be lifted-off. Re-entrant profiles have been created by using with multilayer resists, chemical surface treatments that alter the resist composition, and preferential exposure of the resist surface. However, it may be difficult to incorporate a re-entrant resist profile. It is difficult to create a re-entrant profile when very small features are required or when the resist pattern is created by imprinting.

Further referring to FIG. 3A, the shown profile may be created by electron beam lithography using processes that are well known in the field. In one embodiment, resist 50 is an electron beam resist coated on substrate 112 by spin coating and baking The substrate may comprise silicon, fused silica, or other materials and may include a coating or a plurality of coatings. In the embodiment, a layer of tantalum is coated to 5 nm thickness on the top surface of a fused silica wafer to provide electrical conductivity. The resist 50 may be poly methyl methacrylate (PMMA), ZEP520A (Nippon Zeon Corporation), or any other electron beam resist material. The thickness of the resist 50 film may be in the range of 10 nm to 150 nm. Selected regions of the resist 50 corresponding to a desired pattern are exposed to a finely focused beam of electrons. The resist material 50 is developed by immersing the substrate in a solvent solution. One process for developing PMMA is immersion in a solution of 70% isopropanol and 30% water at 0 degrees Celsius for 60 seconds followed by drying under nitrogen. One process for developing the ZEP520A resist is immersion in amyl acetate at 0 degrees Celsius for 60 seconds followed by rinsing in isopropanol and drying under nitrogen. Following this processing, a resist profile similar to that shown in FIG. 3A is formed. A brief "descum" reactive ion etch (RIE) process may be used to remove resist residues from the now-exposed surface of the substrate. Descum is defined as a plasma operation after develop that ensures full removal of resist from uncovered areas. One descum process comprises processing at 50 to 200 volts DC (direct current) bias with a gas feed mixture of argon (75-100%) and oxygen (0-25%), at a pressure of 5 to 50 mT, for a duration of 0-60 seconds Referring to FIGS. 4A-4C, this contribution describes an advanced lift-off technique that is compatible with a resist process that does not produce a re-entrant profile. First, a resist pattern 50 is created on the substrate 112. This resist pattern 50 may have a sloped sidewall 56. Material 52 is deposited on top of the resist pattern 50 via a directional deposition technique (e.g., vacuum evaporation). Directional evaporation ensures that the thickness of the material 52b on the resist sidewalk 56 is less than the thickness of the material 52a that has been deposited directly on the substrate 112. The deposited material 52 is then etched with an etch process that is substantially isotropic, such that all exposed material 52 is etched at a similar rate. This results in removal of the material 52b that was deposited on the resist sidewalls 56. The isotropic etch also etches the material 52a that was deposited on the substrate 112, but the thickness of this material 52a is thicker and thus material 52a will remain after the sidewall material 52b has been substantially removed. (The isotropic etch may be also tuned to substantially degrade or etch the resist material. For example, radiation-induced resist damage or RIE may be utilized to degrade the resist material and thus further promote lift-off). The RIE process may also be tuned to remove material from the substrate surface at a slower rate than material is removed from the feature sidewalls or the top surface of the resist. After the isotropic etch, the resist 50 is removed with liquid, as mentioned above with respect to FIGS. 2A-2C, which may be agitated by stirring and/or sonication. The extra material 52a positioned on resist pattern 50 is lifted-off into solution, and the material 52a that remains on the substrate is a negative-tone image of the original resist pattern 50, as shown in FIG. 4C.

Figure 4A:
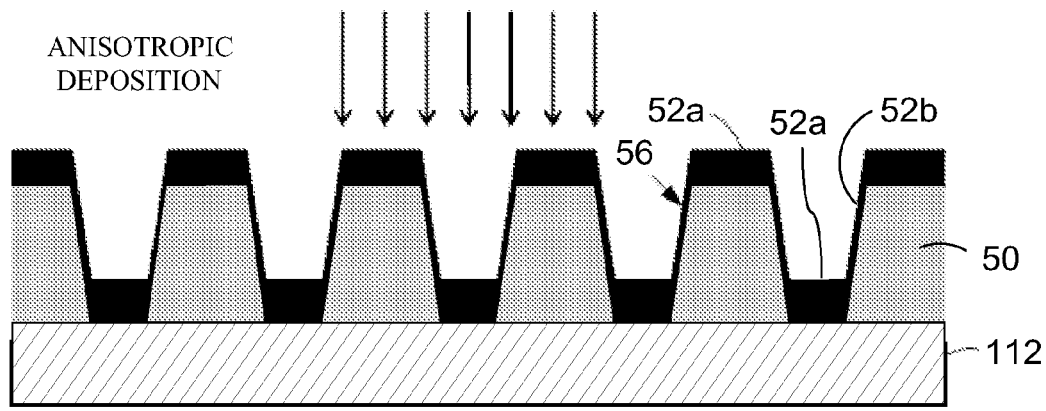
FIG. 4A is a side view of the substrate, shown in FIG. 1, with deposition of material on a resist pattern with sloped sidewalls resulting in sidewall coverage; as a result of the anisotropic nature of the deposition process, the sidewall coverage is thinner than the substrate coverage, wherein additional material is deposited at this step to compensate for the material that will be removed during a subsequent etch step.

Referring to FIGS. 3B and 4A, one method for anisotropic deposition is electron-beam evaporation in a high vacuum system. This process deposits 3 nm to 20 nm Cr (chromium) metal at a rate of 0.1 to 0.5 nm/second.

Figure 4B:
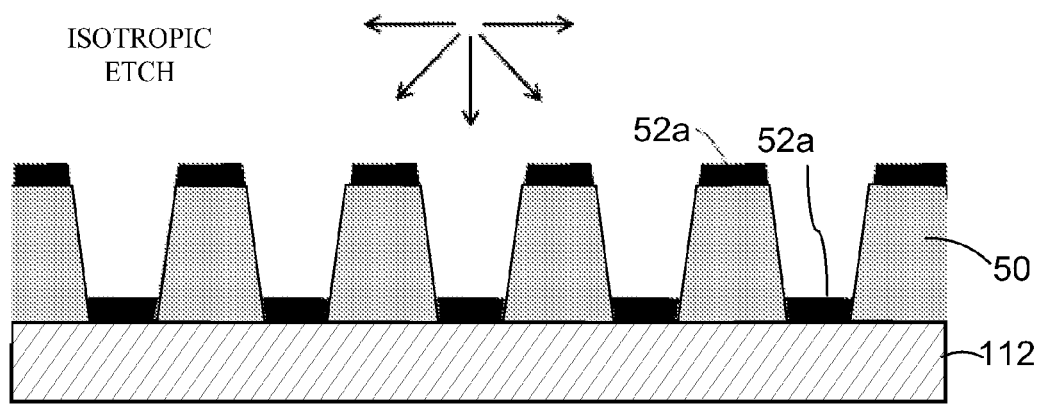
FIG. 4B is a side view of the substrate, shown in FIG. 4A, wherein an isotropic etch is employed to substantially remove the material from the sidewall of the pattern, enabling the lift-off liquid to penetrate and dissolve the resist material, resulting in a thinning of the material on the substrate.

Referring to FIG. 4B, one process for isotropic etching comprises RIE etching at 15 to 150 volts DC bias with a gas feed mixture of chlorine (60-80%) and oxygen (20-40%), at a pressure of 50 to 150 mT, for a duration of 30-120 seconds.

Figure 4C:
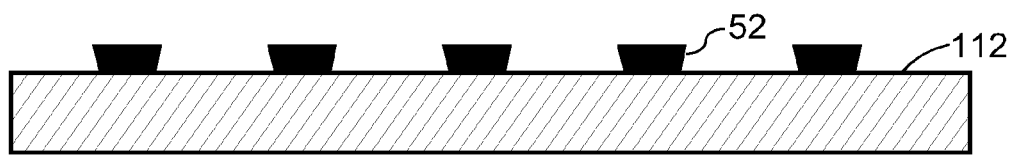
FIG. 4C is a side view of the substrate, shown in FIG. 4B, after immersion in a solvent, the resist material is dissolved and the extraneous material is removed by lift-off into a solution, with the material that remains on the substrate forming a reverse image of the original resist pattern.

Referring to FIG. 4C, one process for lift-off processing comprises immersing the substrate in a solvent that is known to rapidly dissolve the resist material. For PMMA, the one such solvent is dichloromethane. One solvent for ZEP520A is dimethylacetamide. The lift-off process may be performed with the substrate in an inverted orientation, such that solid particles released from the resist surface during lift-off are not deposited on the substrate. In one implementation, this process is performed in an ultrasonic bath to facilitate the lift-off process.

Figure 5A:
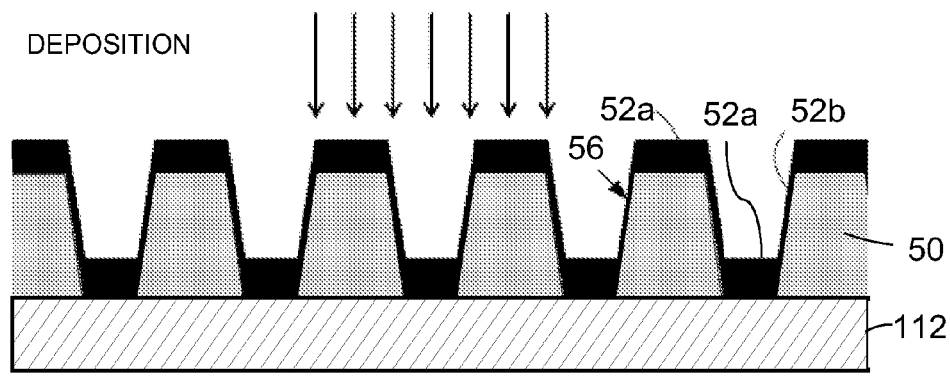
FIG. 5A is a side view of the substrate, shown in FIG. 1, after deposition of material on a resist pattern with sloped sidewalls resulting in sidewall coverage, wherein the anisotropic nature of the deposition process results in the sidewall coverage is thinner than the substrate coverage.
Figure 5B:
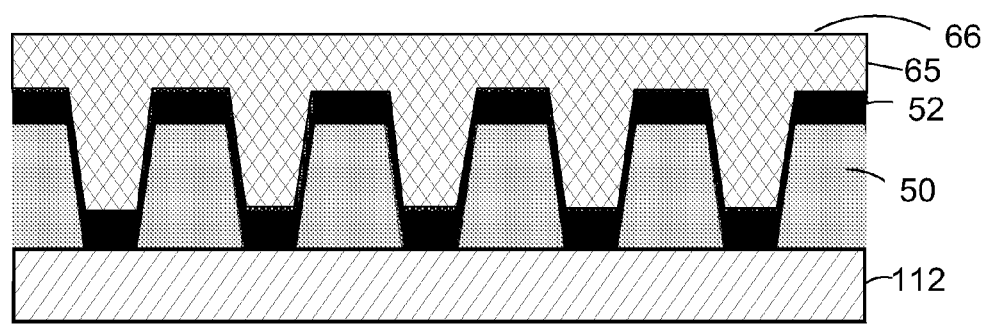
FIG. 5B is a side view of the substrate, shown in FIG. 5A, after a planarizing coating is applied which provides a top surface which is substantially planar.
Figure 5C:
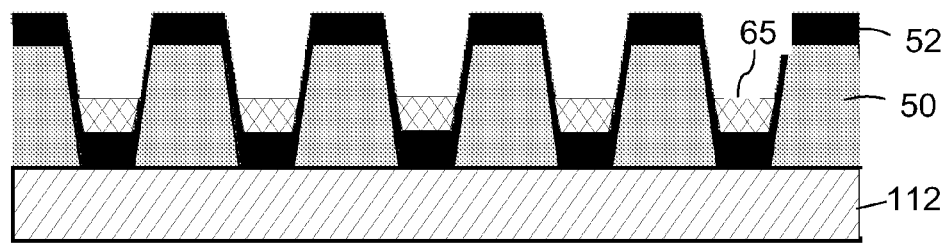
FIG. 5C is a side view of the substrate, shown in FIG. 5B, after the planarizing coating is partially etched, such that the material on top of the resist features is removed, while a substantial portion of the material remains between the resist features.
Figure 5D:
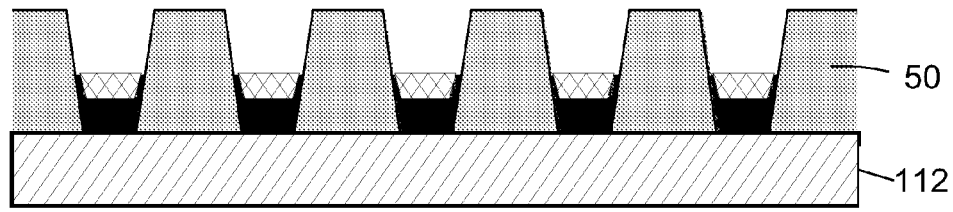
FIG. 5D is a side view of the substrate, shown in FIG. 5C, after the deposited material is etched from the top of the resist feature.
Figure 5E:
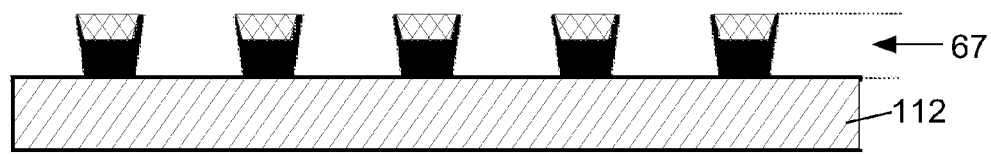
FIG. 5E is a side view of the substrate, shown in FIG. 5D, after the resist is dissolved away, wherein the deposited material remains on the substrate, forming a reverse image of the original resist pattern.

Referring to FIGS. 5A-5C, a further embodiment is shown. First, a resist pattern 50 is created on the substrate 112. The resist pattern 50 may have a sloped sidewall 56. Material 52 is deposited on top of the resist pattern 50. Furthermore, a thickness of material 52b on sidewalls 56 need not be thinner than a thickness of material 52a positioned directly on substrate 112. Next, a coating 65 is applied, in an example, by spin-coating, which provides a top surface 66 that is substantially planar. The planarizing coating 65 has a thickness defined between surface 66 and a top portion of resist features 50 that is less than a thickness defined between the resist features 50. An etch-back step removes portions of the coating 65 from a top surface 52a and sidewalk 52b of material 52, exposing a portion of material 52, while a substantial thickness of the coating 65 remains in between the resist features 50. An etching step, in an example either wet or dry/plasma etching, may then be used to remove the deposited material 52 from on top of the resist features 50, which exposes the underlying resist pattern 50. The resist 50 may then be removed, i.e., via dissolution in solvent, or chemical etching. The material 67 that remains on the substrate is a negative-tone image of the original resist pattern 50. One advantage of this approach is that the extraneous material is removed with a process that is much less prone to defect creation than a solvent lift-off process.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

What is claimed is:

1. A process for forming a first material pattern on a surface of a substrate comprising:
    depositing the first material on a resist material patterned to correspond to an image of the material pattern;
    depositing a second material on the first material, thereby filling any feature depressions in the resist pattern covered by the first material;
    planarizing the second material to form a planarized coating;
    etching the second material to remove the planarized coating from a top surface and sidewalls of the first material, exposing a portion of the first material while leaving a thickness of the second material on the first material on the surface of the substrate;
    etching the exposed portion of the first material to remove the first material from a top surface and sidewalls of the resist pattern; and
    removing the resist pattern by dissolution leaving the first material with the second material on the surface of the substrate thereby forming the first material pattern.

2. The process of claim 1, wherein a thickness of the second material on the top surface of the resist pattern is less than a thickness of the second material in cavities of the resist pattern defining features of the first material pattern.

3. The process of claim 1, wherein the etch of the second material is tuned to substantially degrade the resist material.

4. The process of claim 3, wherein the resist material is degraded using radiation-induced resist damage or reactive ion etching (RIE) to promote removal of the resist material.

5. The process of claim 1, wherein the deposition of the first material is anisotropic.

6. The process of claim 1 further comprising:
    depositing a resist material over an area of the substrate;
    exposing the resist material to an energy source defining selected sections of the resist material as the material pattern; and
    removing the selected portions of the resist material to form the image of the material pattern.

7. The process of claim 1, wherein the second material is deposited using a spin-coating process.

8. The process of claim 1, wherein the second material is deposited via an imprint process.

\* \* \* \* \*